United States Patent
Coyne et al.

(10) Patent No.: US 11,552,190 B2
(45) Date of Patent: Jan. 10, 2023

(54) HIGH VOLTAGE DOUBLE-DIFFUSED METAL OXIDE SEMICONDUCTOR TRANSISTOR WITH ISOLATED PARASITIC BIPOLAR JUNCTION TRANSISTOR REGION

(71) Applicant: Analog Devices International Unlimited Company, Limerick (IE)

(72) Inventors: Edward John Coyne, Athenry (IE); Alan Brannick, Raheen (IE); John P. Meskell, Newport (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/952,500

(22) Filed: Nov. 19, 2020

(65) Prior Publication Data

US 2021/0184033 A1    Jun. 17, 2021

Related U.S. Application Data

(60) Provisional application No. 62/947,452, filed on Dec. 12, 2019.

(51) Int. Cl.
*H01L 29/78*    (2006.01)
*H01L 29/06*    (2006.01)
(Continued)

(52) U.S. Cl.
CPC ...... *H01L 29/7816* (2013.01); *H01L 29/0634* (2013.01); *H01L 29/0649* (2013.01); *H01L 29/404* (2013.01); *H01L 29/66681* (2013.01)

(58) Field of Classification Search
CPC ............. H01L 29/7816; H01L 29/0634; H01L 29/0649; H01L 29/404; H01L 29/66681;
(Continued)

(56) References Cited

U.S. PATENT DOCUMENTS 4,385,337 A    5/1983    Asano et al.
4,811,065 A    3/1989    Cogan
(Continued)

FOREIGN PATENT DOCUMENTS

| EP | 2 434 546 A1 | 3/2012 |
|---|---|---|
| TW | I562374 B | 12/2016 |
| TW | I646653 B | 1/2019 |

OTHER PUBLICATIONS

Extended European Search Report dated Aug. 17, 2021 in counterpart European Application No. 20211255.3.
(Continued)

*Primary Examiner* — Mohammad M Hoque
(74) *Attorney, Agent, or Firm* — Knobbe, Martens, Olson & Bear, LLP

(57) ABSTRACT

A modified structure of an n-channel lateral double-diffused metal oxide semiconductor (LDMOS) transistor is provided to suppress the rupturing of the gate-oxide which can occur during the operation of the LDMOS transistor. The LDMOS transistor comprises a dielectric isolation structure which physically isolates the region comprising a parasitic NPN transistor from the region generating a hole current due to weak-impact ionization, e.g., the extended drain region of the LDMOS transistor. According to an embodiment of the disclosure, this can be achieved using a vertical trench between the two regions. Further embodiments are also proposed to enable a reduction in the gain of the parasitic NPN transistor and in the backgate resistance in order to further improve the robustness of the LDMOS transistor.

10 Claims, 10 Drawing Sheets

(51) Int. Cl.
*H01L 29/40* (2006.01)
*H01L 29/66* (2006.01)

(58) Field of Classification Search
CPC .............. H01L 27/085; H01L 27/0629; H01L 29/0653; H01L 29/1083; H01L 29/42368; H01L 29/7835; H01L 29/0603; H01L 29/0684
USPC ........................................................ 257/288
See application file for complete search history.

(56) References Cited

U.S. PATENT DOCUMENTS

| | | | |
|---|---|---|---|
| 5,218,228 A | 6/1993 | Williams et al. | |
| 5,623,151 A * | 4/1997 | Ajit ................... | H01L 29/7395 257/E29.198 |
| 6,137,140 A | 10/2000 | Efland et al. | |
| 6,242,787 B1 | 6/2001 | Nakayama et al. | |
| 6,365,932 B1 | 4/2002 | Kouno et al. | |
| 6,756,274 B2 | 6/2004 | Williams et al. | |
| 6,833,586 B2 | 12/2004 | Tsuchiko | |
| 6,894,349 B2 | 5/2005 | Beasom | |
| 7,009,261 B2 | 3/2006 | Nakashima | |
| 7,285,828 B2 | 10/2007 | Salcedo et al. | |
| 7,446,375 B2 | 11/2008 | Xu et al. | |
| 7,504,692 B2 | 3/2009 | Dudek et al. | |
| 7,514,329 B2 | 4/2009 | Pendharkar et al. | |
| 7,566,914 B2 | 7/2009 | Salcedo et al. | |
| 7,601,991 B2 | 10/2009 | Salcedo et al. | |
| 7,687,853 B2 | 3/2010 | Penharkar et al. | |
| 7,910,999 B2 | 3/2011 | Lee et al. | |
| 7,911,024 B2 | 3/2011 | Ho et al. | |
| 7,960,222 B1 | 6/2011 | Kwon | |
| 8,035,112 B1 * | 10/2011 | Cooper ................. | H01L 23/544 257/77 |
| 8,044,457 B2 | 10/2011 | Salcedo et al. | |
| 8,222,698 B2 | 7/2012 | Salcedo et al. | |
| 8,278,710 B2 | 10/2012 | Khemka et al. | |
| 8,319,255 B2 | 11/2012 | Vashchenko | |
| 8,320,091 B2 | 11/2012 | Salcedo et al. | |
| 8,368,116 B2 | 2/2013 | Salcedo et al. | |
| 8,378,420 B2 | 2/2013 | Mallikarjunaswamy | |
| 8,416,543 B2 | 4/2013 | Salcedo | |
| 8,422,187 B2 | 4/2013 | Parthasarathy et al. | |
| 8,432,651 B2 | 4/2013 | Salcedo et al. | |
| 8,466,489 B2 | 6/2013 | Salcedo et al. | |
| 8,553,380 B2 | 10/2013 | Salcedo | |
| 8,564,065 B2 | 10/2013 | Donovan et al. | |
| 8,592,860 B2 | 11/2013 | Salcedo et al. | |
| 8,610,251 B1 | 12/2013 | Salcedo | |
| 8,637,899 B2 | 1/2014 | Salcedo | |
| 8,665,571 B2 | 3/2014 | Salcedo et al. | |
| 8,680,620 B2 | 3/2014 | Salcedo et al. | |
| 8,704,303 B2 | 4/2014 | Mallikarjunaswamy | |
| 8,723,227 B2 | 5/2014 | Salcedo et al. | |
| 8,796,729 B2 | 8/2014 | Clarke et al. | |
| 8,860,080 B2 | 10/2014 | Salcedo | |
| 8,946,822 B2 | 2/2015 | Salcedo et al. | |
| 8,947,841 B2 | 2/2015 | Salcedo et al. | |
| 8,958,187 B2 | 2/2015 | Parthasarathy et al. | |
| 9,006,781 B2 | 4/2015 | Salcedo et al. | |
| 9,088,256 B2 | 7/2015 | Cosgrave et al. | |
| 9,123,540 B2 | 9/2015 | Salcedo et al. | |
| 9,147,677 B2 | 9/2015 | Salcedo et al. | |
| 9,153,666 B1 | 10/2015 | Iravani et al. | |
| 9,171,832 B2 | 10/2015 | Salcedo et al. | |
| 9,184,098 B2 | 11/2015 | Salcedo et al. | |
| 9,209,683 B2 | 12/2015 | Kalnitsky | |
| 9,275,991 B2 | 3/2016 | Salcedo et al. | |
| 9,293,912 B2 | 3/2016 | Parthasarathy et al. | |
| 9,478,608 B2 | 10/2016 | Salcedo et al. | |
| 9,525,078 B2 | 12/2016 | Li et al. | |
| 9,634,482 B2 | 4/2017 | Parthasarathy et al. | |
| 9,666,671 B2 | 5/2017 | Zhang et al. | |
| 10,050,115 B2 | 8/2018 | Brown et al. | |
| 10,249,708 B2 | 4/2019 | Yoshida et al. | |
| 10,269,916 B2 | 4/2019 | Xia et al. | |
| 10,290,702 B2 | 5/2019 | Stuber et al. | |
| 2002/0017683 A1 * | 2/2002 | Jeon ................... | H01L 29/7835 257/E29.066 |
| 2002/0081783 A1 | 6/2002 | Lee et al. | |
| 2002/0149067 A1 | 10/2002 | Mitros et al. | |
| 2002/0185695 A1 * | 12/2002 | Beasom ............... | H01L 29/7816 257/E29.256 |
| 2004/0251492 A1 | 12/2004 | Lin | |
| 2006/0033163 A1 | 2/2006 | Chen | |
| 2007/0158681 A1 * | 7/2007 | Kim ..................... | H01L 27/088 257/E27.06 |
| 2010/0327343 A1 | 12/2010 | Salcedo et al. | |
| 2011/0121389 A1 * | 5/2011 | De Boet ............. | H01L 29/7835 257/E29.256 |
| 2011/0241083 A1 * | 10/2011 | Khemka ........... | H01L 29/66659 257/E27.059 |
| 2013/0001685 A1 | 1/2013 | Shirakawa et al. | |
| 2015/0255450 A1 | 9/2015 | Shrivastava et al. | |
| 2015/0340448 A1 | 11/2015 | Babcock et al. | |
| 2016/0204096 A1 | 7/2016 | Zhao et al. | |
| 2016/0261110 A1 | 9/2016 | Ivanov et al. | |
| 2016/0285255 A1 | 9/2016 | O'Donnell et al. | |
| 2016/0300830 A1 | 10/2016 | Salcedo et al. | |
| 2016/0336740 A1 | 11/2016 | Parthasarathy et al. | |
| 2016/0336744 A1 | 11/2016 | Parthasarathy et al. | |
| 2017/0243862 A1 | 8/2017 | Parthasarathy et al. | |
| 2017/0256534 A1 | 9/2017 | Parthasarathy et al. | |
| 2017/0317070 A1 | 11/2017 | Salcedo et al. | |
| 2017/0366002 A1 | 12/2017 | Zhao et al. | |
| 2018/0026440 A1 | 1/2018 | Zhao et al. | |
| 2019/0189737 A1 | 6/2019 | Koshimizu et al. | |

OTHER PUBLICATIONS

Han et al., "Improving Breakdown Voltage of LDMOS Using a Novel Cost Effective Design", IEEE Transactions on Semiconductor Manufacturing, vol. 26, No. 2, May 2013, pp. 248-252.

Salcedo et al., "Electrostatic Discharge Protection Framework for Mixed-Signal High Voltage CMOS Applications", IEEE International Conference on Solid-State and Integrated-Circuit Technology, 2008, 4 pages.

Salcedo et al., "Analysis of Safe Operating Area of NLDMOS and PLDMOS Transistors Subject to Transient Stresses," in IEEE Transactions on Electron Devices, vol. 57, No. 10, pp. 2655-2663, Oct. 2010, 9 pages.

Theeuwen et al., "Amplify the future—LDMOS Ruggedness Reliability", Original publication: Microwave Journal, technical feature, Apr. 2009, pp. 96-104 (2009), 5 pages.

Office Action dated Sep. 14, 2021 in Taiwan Application No. 109143358.

Partial European Search Report dated Apr. 19, 2021 in counterpart European Application No. 20211255.3.

* cited by examiner

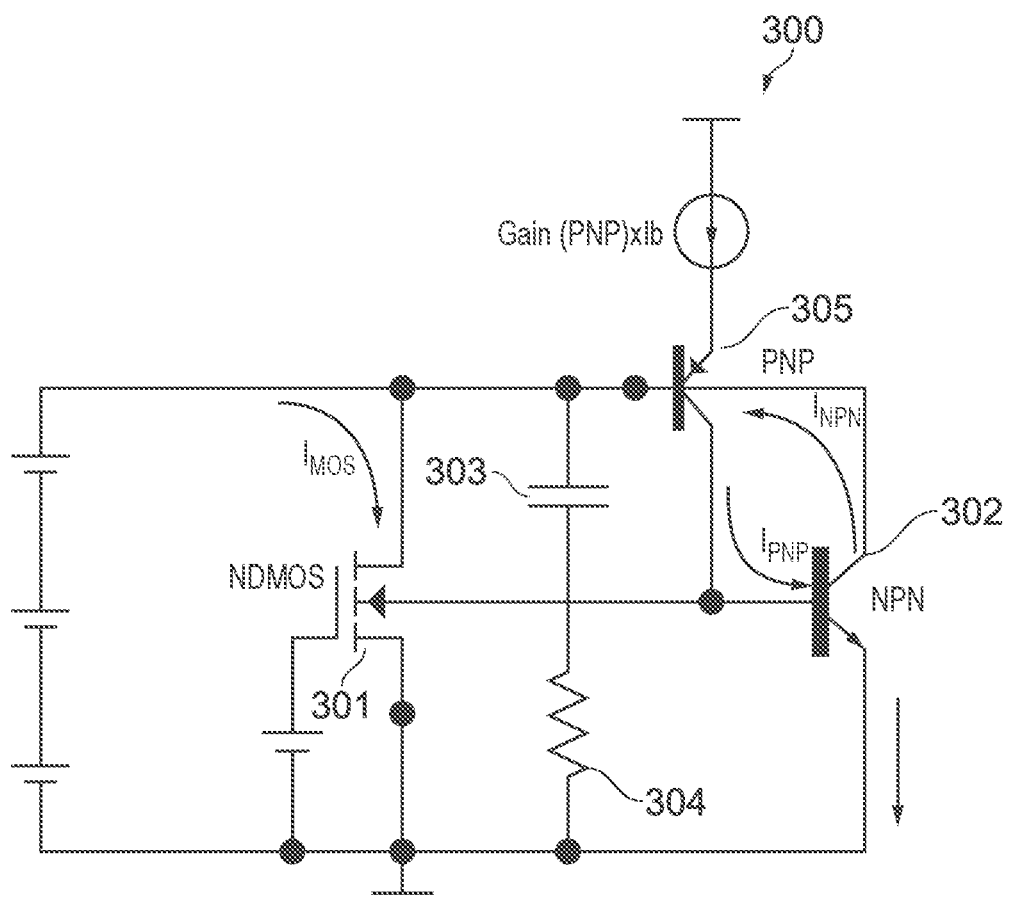
FIG. 3C(ii)

HIGH VOLTAGE DOUBLE-DIFFUSED METAL OXIDE SEMICONDUCTOR TRANSISTOR WITH ISOLATED PARASITIC BIPOLAR JUNCTION TRANSISTOR REGION

INCORPORATION BY REFERENCE

This application claims the benefit of priority of U.S. Provisional Application No. 62/947,452, filed Dec. 12, 2019, the content of which is hereby incorporated by reference in its entirety.

FIELD OF THE DISCLOSURE

The present disclosure relates to a lateral double-diffused metal oxide semiconductor (LDMOS) transistor, and more particularly to an n-channel LDMOS transistor with a modified structure to improve the robustness of the transistor during its operation.

BACKGROUND

High voltage integrated circuits or HVICs are predominantly used in power-conversion applications. The lateral double-diffused MOS transistor or LDMOS transistor is a common component of HVICs. However, there is a need for an improved, robust device architecture of the LDMOS transistor with improved reliability during the operation thereof.

SUMMARY

The present disclosure relates to an n-channel LDMOS transistor with a modified structure to improve the robustness of the transistor during its operation. In particular, it relates to an n-channel LDMOS transistor with a modified structure to avoid completely, or at least to reduce, the occurrence of gate oxide rupture during the operation of the transistor.

A modified structure of a lateral n-channel LDMOS transistor is provided to avoid the rupturing of the gate-oxide which occurs during the operation of the transistor. The LDMOS transistor comprises a dielectric isolation structure which physically isolates the region comprising a parasitic NPN transistor from the region generating a hole current due to weak-impact ionization, that is, the extended drain region of the LDMOS transistor. According to an embodiment of the disclosure, this can be achieved using a vertical trench between the two regions. Further embodiments are also proposed to enable a reduction in the gain of the parasitic NPN transistor and in the backgate resistance in order to further improve the robustness of the LDMOS transistor.

According to a first aspect of this disclosure, there is provided an LDMOS transistor comprising: a drain; a gate; a source; and a backgate; wherein the LDMOS transistor further comprises an isolation structure configured to physically isolate a first region comprising the drain of the LDMOS transistor from a second region, having, in use, a parasitic bipolar junction transistor.

According to a second aspect of this disclosure, there is provided a lateral n-channel LDMOS transistor, comprising: a drain; a gate; a source; and a backgate; wherein the LDMOS transistor further comprises: a field oxide region extending laterally between the drain and the gate; a gate oxide region extending laterally between an edge of the field oxide region and the source; a p-doped region configured to reduce, in use, the gain of a parasitic bipolar transistor, the p-doped region being embedded in a p-well region under the source and the backgate wherein the p-doped region comprises a buried p-doped layer separated from the source and backgate by the remainder of the p-well region, and wherein an edge of the buried p-doped layer is configured to be aligned with an edge of the gate proximal to a transition between the field oxide region and the gate oxide region.

According to a third aspect of this disclosure, there is provided a lateral n-channel LDMOS transistor comprising: a first region configured to operate, in use, as a virtual JFET; a second region configured to operate, in use, as a virtual MOSFET, wherein the first region generates, during use, a first current due to weak-impact ionization, wherein the second region generates, during use, a second current due to a parasitic NPN transistor in the second region, and wherein the first region is configured to be isolated from the second region such that the first current is not proportional to the second current.

BRIEF DESCRIPTION OF THE DRAWINGS

FIG. 3C(ii) is circuit schematic of the concept illustrated in FIG. 3C(i).

DETAILED DESCRIPTION

Figure 1:
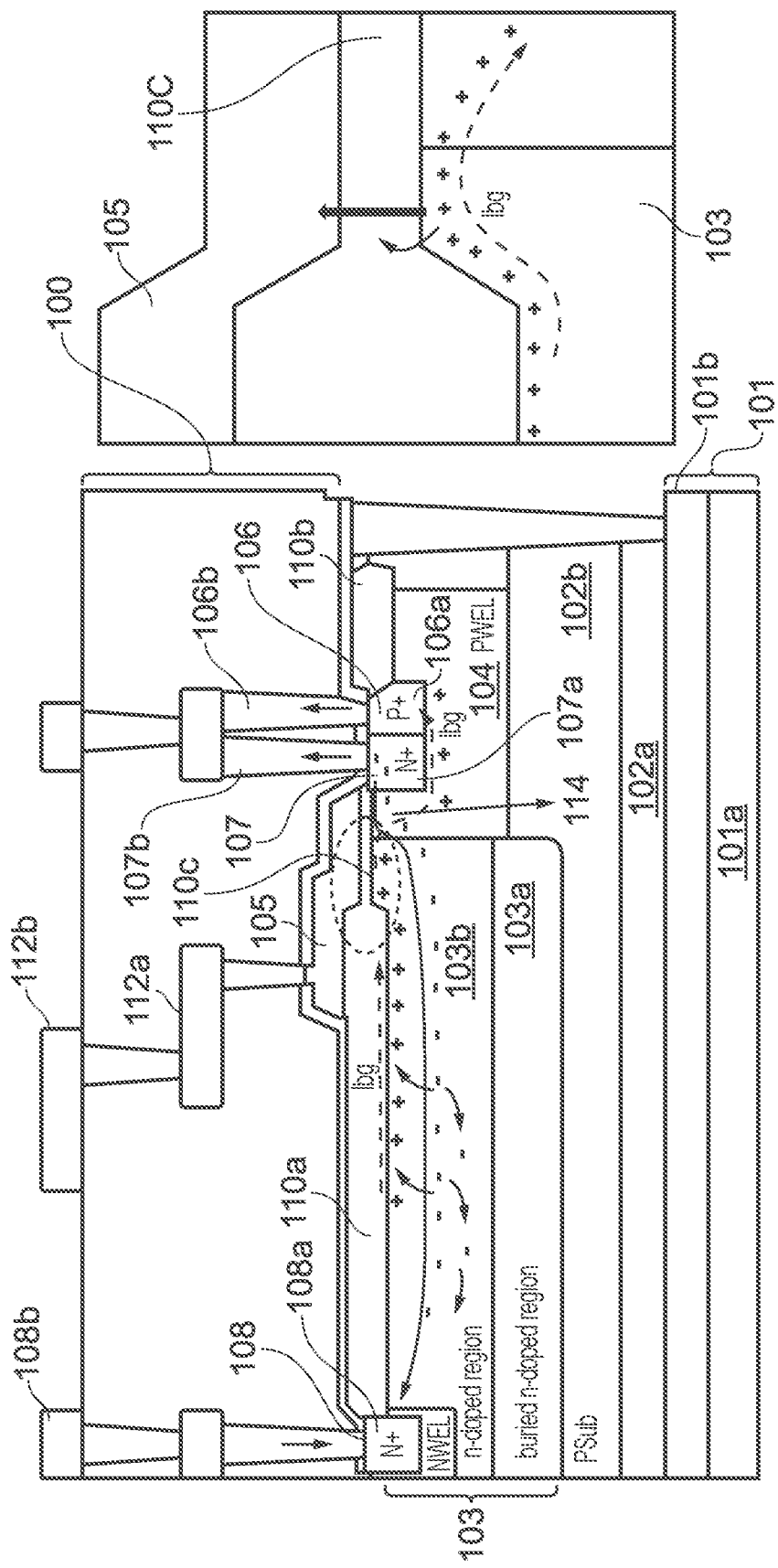
FIG. 1A is a cross-section through an n-channel LDMOS device.
FIG. 1B is an example of a gate-oxide rupture mechanism occurring during the operation of the device of FIG. 1A.

The inventors have recognized that gate-oxide rupture can occur in an n-channel LDMOS device while the device is in operation and can lead to the eventual breakdown of the device. This type of rupture is distinct from gate oxide ruptures which are fabrication defects as the former occurs during the operation of the device. Thus, there is a need for improved, robust device architecture to resolve the problem of gate oxide rupture during the operation of an n-channel LDMOS device.

The present disclosure relates to an n-channel LDMOS transistor with a modified structure to improve the robustness of the transistor during its operation. In particular, it relates to an n-channel LDMOS transistor with a modified structure to avoid completely, or at least reduce, the occurrence of gate oxide rupture during the operation of the transistor. The occurrence of gate oxide ruptures can be reduced by modifying dimensions of and/or alignment between individual structures in the LDMOS device. However, the inventors have found such solutions to be very restrictive from a design and fabrication perspective. The inventors have recognized that the occurrence of gate oxide rupture is related to the activation of the parasitic NPN bipolar transistor in a transient mode of operation of the LDMOS transistor. In particular, without being bound to any theory, the inventors have recognized that, in the transient mode, the hole current density, due to weak impact ionization, is proportional to the current from the parasitic NPN bipolar transistor, and it is this hole current which is tunneled under a high electric field across the gate oxide resulting in the rupture of this oxide. More significantly, the inventors have recognized that, during the transient operation mode of the LDMOS device (for example, during a glitch), the hole current due to weak-impact ionization can be understood as being emitted by an emitter of a PNP transistor. This PNP bipolar junction transistor can be understood to operate in conjunction with the parasitic NPN bipolar junction transistor to result in a current $I_{PNP}$ which is proportional to the current $I_{NPN}$ generated by the parasitic NPN bipolar junction transistor.

In order to avoid, or at least reduce, the rupturing of gate oxide in transient mode, the inventors have modified the structure of the LDMOS transistor such that the above-mentioned mechanism is prevented or at the least, the likelihood of its occurrence is reduced.

The structure of the LDMOS transistor can be modified to reduce a gain of the parasitic NPN bipolar junction transistor which is activated when the LDMOS transistor operates in a transient mode, for example due to a spike or glitch in the power supply. One such structure is disclosed in an embodiment of this disclosure by providing a buried p-doped region in a p-well region under the source and backgate of the LDMOS transistor. The buried p-doped region has the effect of adding dopant to the base of the parasitic NPN bipolar transistor, thereby reducing the gain of the parasitic NPN bipolar transistor. The incorporation of the buried p-region as mentioned above, also helps to reduce the backgate resistance, thereby decreasing the likelihood of the activation of the parasitic NPN bipolar transistor in the transient mode.

In another embodiment, a highly doped p-type region is placed directly under the source and the backgate so that it forms a junction with the n-doped region of the source and the p-doped region of the backgate. This modification to the LDMOS structure also has the effect of reducing a gain of the parasitic NPN bipolar transistor as well as reducing the back-gate resistance, thereby decreasing the likelihood of activating the parasitic bipolar transistor in a transient mode.

Most importantly however, the inventors have devised a modification to avoid the rupturing of the gate-oxide by physically isolating the region comprising the parasitic NPN transistor from the region generating the hole current, that is, the extended drain region of the LDMOS transistor. According to an embodiment of the disclosure, this can be achieved using a vertical trench between the two regions. This embodiment has the additional advantage that the second region does not need to be adjacent the first region and can be placed at a desired location on a chip implementing the LDMOS device, thereby enabling a greater freedom in chip design, in particular when optimizing the usage of a given chip area.

As used herein, the terms "above", "below", "at a side of" and so on refer to components or regions as set out in the accompanying figures and are not intended to be limiting of real world devices.

Figure 2:
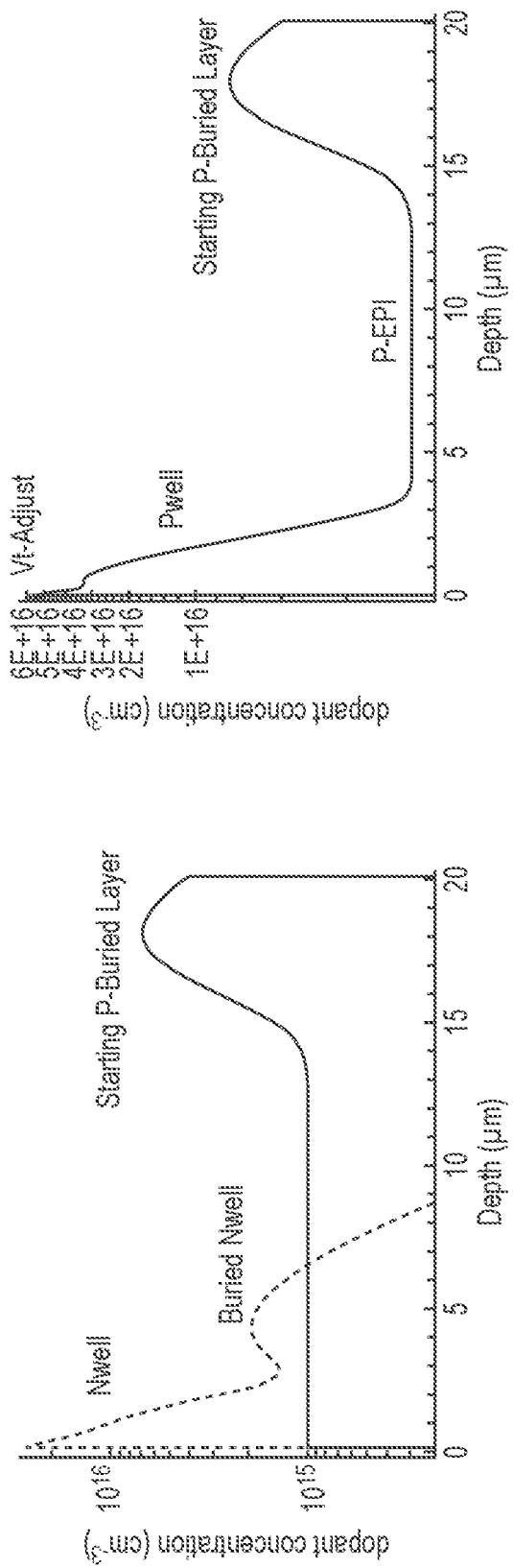
FIG. 2 shows an example doping concentration profile of the different regions of the device of FIG. 1A.

FIG. 1A illustrates a cross-section of an n-channel LDMOS device 100 on a silicon-on-oxide substrate 101. A dielectric layer of silicon dioxide 101b (buried oxide or BOX layer) overlies the bulk silicon support wafer 101a. A doped silicon region 102 which, in FIG. 1A, is a p-doped region or p-substrate, overlies the buried oxide layer 101b. The p-substrate may be a multilayer substrate comprising of a buried p-doped silicon layer 102a directly over the buried oxide 101b and a p-doped epitaxially grown silicon layer 102b directly over the buried p-doped silicon layer 102a. The LDMOS device further comprises an n-doped region or n-well 103 embedded in part of the p-substrate. The device also comprises a p-doped region or p-well 104 also embedded in the p-substrate, where the p-well is laterally adjacent to the n-well. As will be explained in a later section, the n-well 103 forms an extended drain drift region of the n-channel LDMOS device. The n-well region 103 may be a multilayer region comprising a buried n-doped region 103a in the p-substrate and an n-doped region 103b over the buried n-doped region. FIG. 2 shows an example doping concentration profile of the different regions of the device of FIG. 1A.

The device further comprises a dielectric trench on at least one side of the device, wherein the dielectric trench is isolated from the bulk silicon region of the device. In FIG. 1A, the device comprises a dielectric trench proximal to the p-well 104.

The device comprises a gate 105, a back-gate 106, a source 107 and a drain 108.

As shown in FIG. 1A, the source 107 and the drain 108 are on laterally opposing sides of the gate 105. The back-gate 106 is laterally adjacent to the source 107. The source 107 comprises an n-doped region 107a embedded into the top surface of the p-well 104, where the n-doped region 107a has a higher overall dopant concentration than the n-well 103. The back-gate 106 comprises a p-doped region 106a embedded into the top-surface of the p-well and laterally adjacent to the n-doped region 107a, where the p-doped region 106a has a higher overall dopant concentration than the p-well 104. The drain 108 comprises an n-doped region 108a embedded into the top surface of the n-well 103. The n-doped region 108a has a higher overall dopant concentration than the n-well 103.

The device also comprises a dielectric region 110 on the top surface. The electrical contact to the source 107 and the electrical contact to the drain 108 are formed using metal vias 107b, 108b respectively, which extend through apertures in the dielectric layer to contact the regions 107a of the source 107 and 108a of the drain 108, respectively. The dielectric region 110, preferably comprising an oxide layer, comprises of LOCOS oxide regions 110a, 110b and a gate oxide region 110c.

The gate 105 comprises a polysilicon gate layer 105a extending over a portion of the n-well 103 and a portion of the p-well 104, the polysilicon gate layer 105a being separated from the n-well and the p-well by the LOCOS oxide region 110a and the gate oxide 110c.

FIG. 1A also shows a resurf structure comprising a first field plate 112a of a predetermined length, embedded in the dielectric region 110 and electrically connected to a metal via which extends through the dielectric region 110 to contact the gate polysilicon layer 110. The resurf structure further comprises a second field plate 112b of a predetermined length on the surface of the dielectric region 110. The second field plate 112b is positioned above the first field plate 112a and is connected to the first field plate 112a through a metal via extending through the dielectric region 110. The first field plate 112a in FIG. 1A also serves as the gate contact.

FIG. 1A shows that the LOCOS field oxide region 110a has a predetermined lateral distance, extending between the drain towards the gate. The LOCOS field oxide region 110a has a predetermined depth, extending vertically through the top surface of the device into the n-well 103. The gate oxide 110c extends laterally, over the surface of the device, between an end (bird's beak) of the LOCOS field oxide region 110a and the n-doped region 107a of the source 107. The gate oxide region is thinner in comparison to the field oxide region. The thickness of the gate oxide 110c may be at least two orders of magnitude less than the thickness of the LOCOS field oxide 110a. For example, the gate oxide region could have a thickness of at least 15 nm whereas the LOCOS field oxide could have a thickness of at least 400 nm.

In practical applications, the source terminal 107b is electrically shorted with the back gate terminal 106b as shown in FIG. 1A, and the two terminals are held at the same potential to avoid the activation of a parasitic NPN bipolar junction transistor.

As seen in FIG. 1A, applying a potential at the gate results in the formation of a conductive inversion layer or a channel 114 between the source 107 and the drain 108. Subsequent biasing of the drain 108 of the device relative to the source 107 allows for the movement of majority carriers or electrons from the source 107 to the drain 108 via the conductive channel 114. FIG. 1A also shows that a depletion region is created that extends into the channel region and also across the lightly doped extended drift region, diluting the internal electric field and thereby enabling high voltage operation.

The depletion region creates an internal electric field which is below the critical field needed to initiate an impact ionization chain reaction that defines the breakdown voltage $V_{BD}$ of the device. However, the combination of channel current with the electric field over the extended drift region creates weak impact ionization producing minority carriers or holes for an n-channel LDMOS device—this hole current or backgate current $I_{bg}$ flows from the drain drift region in the direction towards the source/backgate.

The inventors have discovered that the rupture in the gate oxide can be dependent on the density of the above-mentioned hole current and the strength of the electric field across the gate oxide 110c. The gate oxide rupture is observed during the transient mode operation of the LDMOS device due to holes from the back-gate current tunneling through the gate oxide, as a result of the electric field across the gate oxide, as also shown in FIG. 1B.

In practical applications of the LDMOS device, the shorting of the source terminal 107b to the back-gate terminal 106b prevents the activation of the parasitic NPN bipolar junction transistor 113. However, despite the shorted connection, the parasitic NPN transistor can be activated due to a glitch such as a voltage overshoot as a result of a spike in the power supply voltage. During this transient mode of operation of the LDMOS device, the hole current, resulting from weak impact ionization, is observed to be proportional to the number of electrons injected into the drain.

Figure 3A:
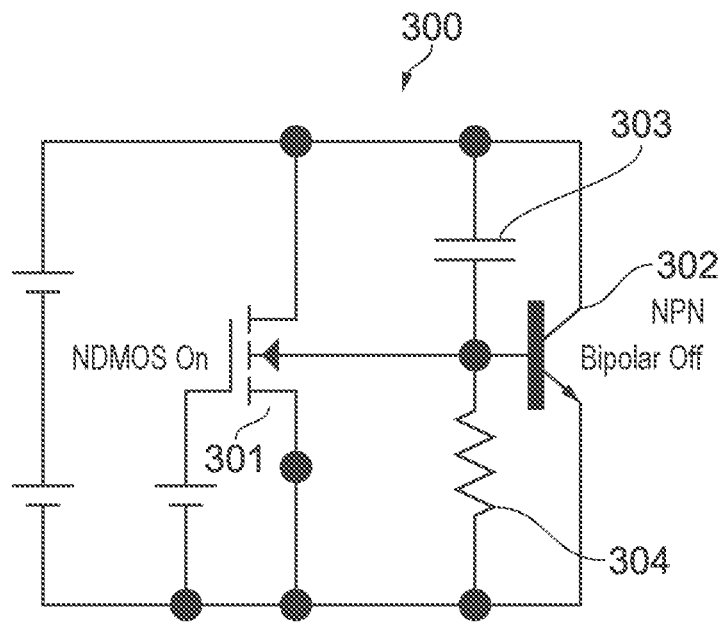
FIG. 3A is a reference circuit schematic of an LDMOS device when the parasitic NPN bipolar transistor is off.
Figure 3B:
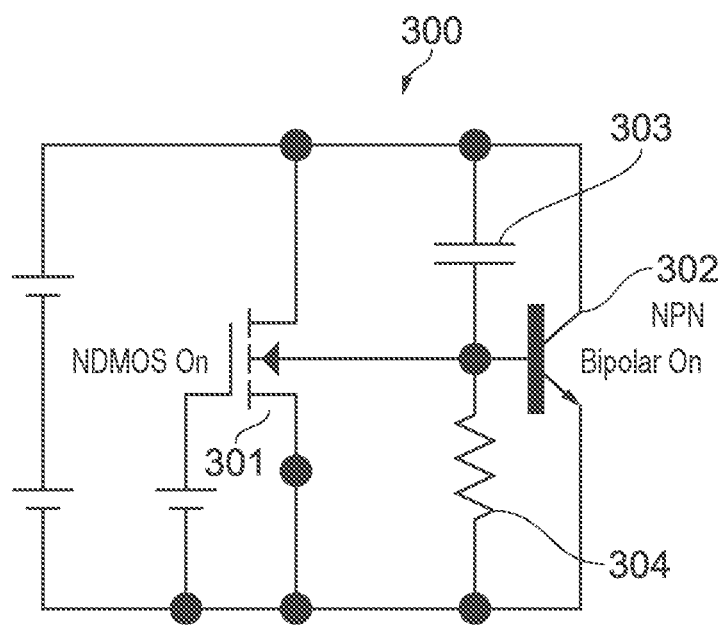
FIG. 3B is a circuit schematic of an LDMOS device for activating the parasitic NPN bipolar transistor.

The inventors were able to reproduce the rupture of the gate oxide during transient mode operation of the LDMOS device using a test circuit 300 as shown in FIGS. 3A and 3B to model the LDMOS device. The test circuit 300 comprises an n-channel LDMOS transistor 301 coupled to an NPN bipolar junction transistor 302, wherein the transistor 302 represents the parasitic NPN transistor which can be activated during operation of the n-channel LDMOS as described above. The test circuit 300 also comprises a capacitor 303 to model the back-gate capacitance and a resistor 304 to model the back-gate resistance. FIG. 3A shows the test circuit 300 with the parasitic NPN transistor in the 'off' mode, that is, not activated. FIG. 3B shows the test circuit 300 with the parasitic NPN in the 'on' mode, that is, FIG. 3B models the n-channel LDMOS with the parasitic NPN transistor being activated during operation of the device.

Using the test circuit 300, the inventors activated the parasitic NPN bipolar transistor 302 and observed a significant increase in hole density, particularly at the transition between the field oxide region 110a and gate oxide 110c (see FIG. 1A) when compared to the corresponding hole density in the reference circuit. For the test conducted using the circuit 300 in FIG. 3B, the inventors found that the forced activation of the parasitic NPN bipolar transistor resulted in an increase of three orders of magnitude in hole density at the transition between the field oxide to the gate oxide when compared to the reference circuit in FIG. 3A where the parasitic bipolar junction transistor is off. For the test circuit in FIG. 3B, the inventors observed a rupture in the gate oxide at the transition between the field oxide and the gate oxide.

Figure 3C:
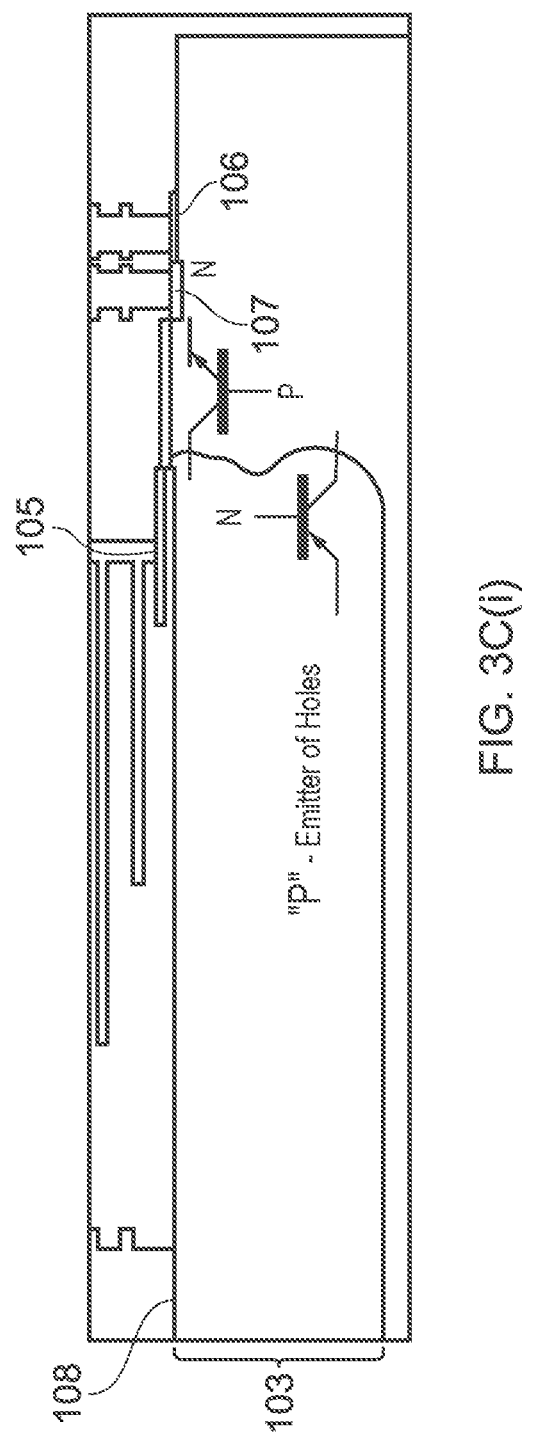
FIG. 3C(i) is a cross-section of an LDMOS device illustrating the concept of a PNP transistor as the source of the backgate current during transient mode operation of an LDMOS device.

FIG. 3C(i) is a simplified version of the cross section of the device shown in FIG. 1A. An important realization by the inventors is that, during the transient operation mode of the LDMOS device (for example, during a glitch), the hole current due to weak-impact ionization can be understood as being emitted by an emitter of a PNP transistor as indicated in the cross-section in FIG. 3C(i). The transient mode operation of the LDMOS device can be modelled using the test circuit 300 as shown in FIG. 3C(ii). As seen in FIG. 3C(ii), the PNP bipolar junction transistor 305 can be understood to operate in conjunction with the parasitic NPN bipolar junction transistor 302 to result in a current $I_{PNP}$ that flows in the opposite direction to the current $I_{NPN}$ generated by the parasitic NPN bipolar junction transistor 302. The emitter of the PNP transistor 305 can therefore be viewed as an emitter of holes and the two bipolar junction transistors 302, 305, operate together, as indicated in FIG. 3C(ii), such that the weak impact ionization effect which results in minority carriers flowing towards the source is proportional to $I_{NPN}$.

The inventors have found that gate oxide ruptures occur during the transient mode operation of the device, in particular, when the gain product of the two bipolar transistors exceeds 1. In order to address this issue, the inventors have proposed modifications to the LDMOS device which will be explained in detail below.

Figure 5A:
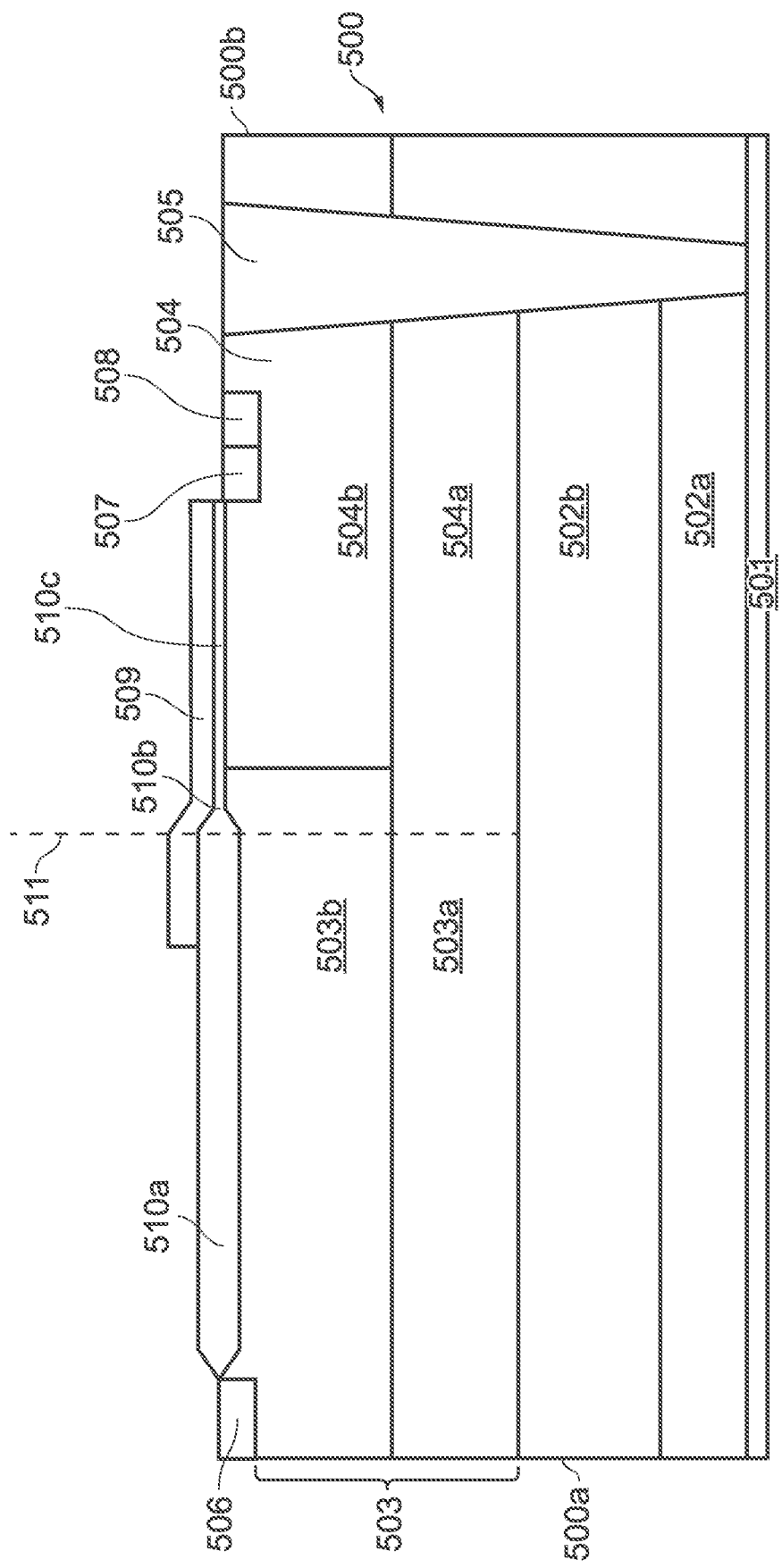
FIG. 5A is a cross-section through an n-channel LDMOS device according to a another embodiment of this disclosure.
Figure 5B:
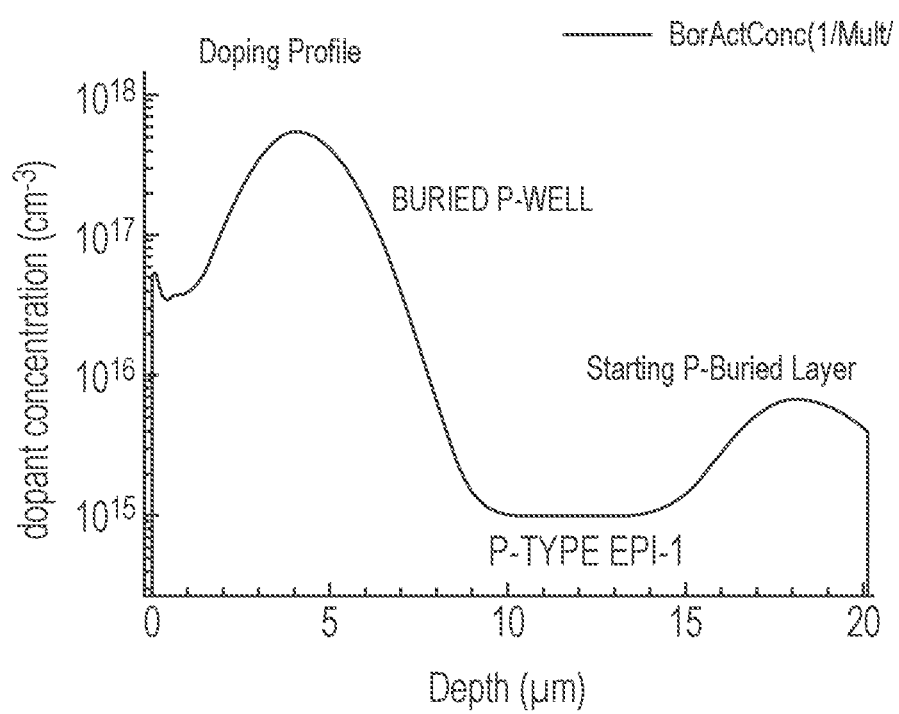
FIG. 5B shows an example doping concentration profile of the different regions of the device of FIG. 5A.
Figure 6:
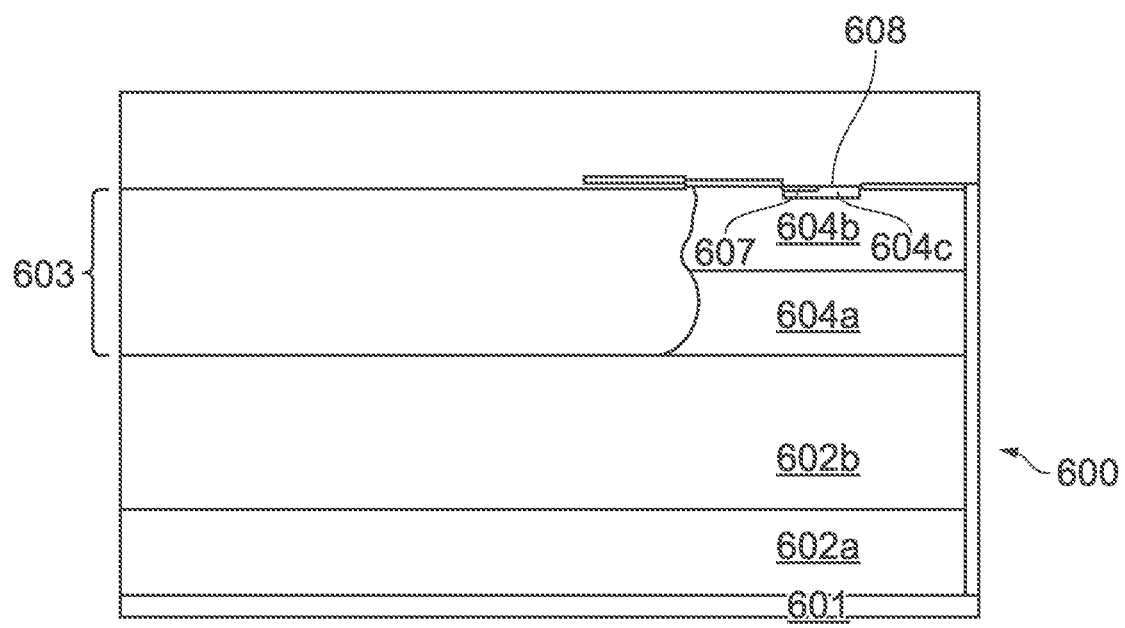
FIG. 6 is a cross-section through an n-channel LDMOS device according to another embodiment of this disclosure.

We will now describe, by way of FIGS. 4-6, different embodiments of the present disclosure, where the structure of the LDMOS transistor is modified to avoid, or at least reduce, the gate oxide rupture during a transient mode operation of the LDMOS device.

Figure 4A:
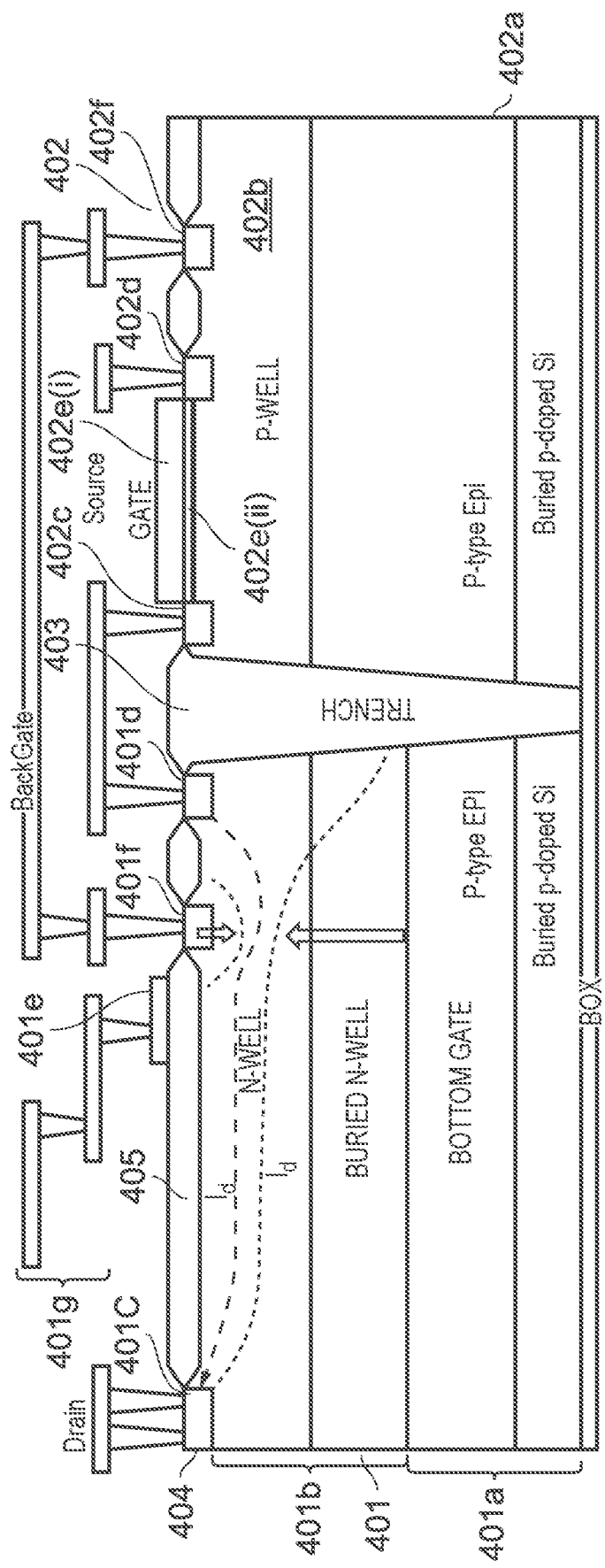
FIG. 4A is a cross-section through an n-channel LDMOS device according to a first embodiment of this disclosure.

FIG. 4A is a first embodiment 400 of an LDMOS device according to the present disclosure. The LDMOS device in FIG. 4A is designed to avoid the above-mentioned rupturing of gate oxide during a transient-mode operation of the device. The LDMOS device 400 has a first section 401 and a second section 402, where the first section 401 and the second section 402 are separated by a vertical trench 403. The trench 403 is dielectrically isolated from the two sections. The trench is filled with a dielectric layer, preferably an oxide layer.

The first section 401 is formed on a silicon-on-oxide substrate (not shown). The first section comprises a p-substrate 401a similar to the p-substrate as described for the device in FIG. 1A above. The first section 401 further comprises an n-well region 401b, over the p-substrate 401a, similar to the n-well structure as described for the device in FIG. 1A above.

In FIG. 4A, the drain 401c, is proximal to a first side 404 of the device. The first section 401 further comprises a second n-doped region 401d proximal to the trench. The n-well 401b extends laterally from the drain 401c to the second n-doped region 401d. The drain 401c and the second n-doped region 401d are embedded in the top surface of the n-well region 401b.

The first section 401 also comprises a polysilicon structure 401e of a predetermined length separated from a top surface of the device, in particular, from a top surface of the n-well 401b, by a dielectric layer, preferably a LOCOS oxide layer 405. The first section further comprises a p-doped backgate 401f wherein the p-doped backgate is positioned laterally between the polysilicon structure 401e and the second n-doped region 401d, the p-doped backgate being laterally separated from the polysilicon structure 401e and the second n-doped region 401d by the dielectric regions such as LOCOS oxide regions 405.

The second section 402 is also formed on the silicon-on-oxide substrate (not shown). The second section comprises a p-substrate 402a. The p-substrate 402a of the second section 402 is thicker than the p-substrate 401a of the first section 401. In the device of FIG. 4A, each of the p-substrates 401a, 402a for the first and second sections 401, 402, respectively, comprise a buried p-doped silicon layer on BOX layer and an epitaxially grown p-doped silicon layer directly over the buried p-doped silicon layer. In FIG. 4A, the epitaxially grown p-doped layer of the p-substrate 402a of the second section 402 is thicker than the epitaxially grown p-doped layer of the p-substrate 401a of the first section 401. The second section 402 further comprises a p-doped region or p-well 402b directly over the p-substrate 402a.

The second section comprises a first n-doped region 402c and a second n-doped region or source 402d on laterally opposing sides of a gate structure 402e comprising a polysilicon gate layer 402e(i) on gate oxide 402e(ii), wherein the polysilicon gate layer 402e(i) is separated from the surface of the p-well 402b by the gate oxide 402e(ii), similar to the gate of the device in FIG. 1A. The first n-doped region 402c of the second section 402 is positioned laterally between the trench 403 and the gate structure 402e. The source 402d is positioned laterally between the gate structure 402e and a p-doped backgate region 402f wherein, the source is laterally separated from the gate and the p-doped backgate region by dielectric regions such as LOCOS oxide regions.

The device also comprises a dielectric layer (not shown) over the top surface of the device and the polysilicon structures, similar to that in the device of FIG. 1A. The LOCOS oxide regions described above also form part of this dielectric layer. The electrical contacts to the drain, polysilicon structures, backgate and n-doped regions in the two sections can be formed using respective metal vias extending through apertures in the dielectric layer. The device may also comprise a resurf structure 401g similar to the resurf structure 112 in the device 100 of FIG. 1A.

Figure 4B:
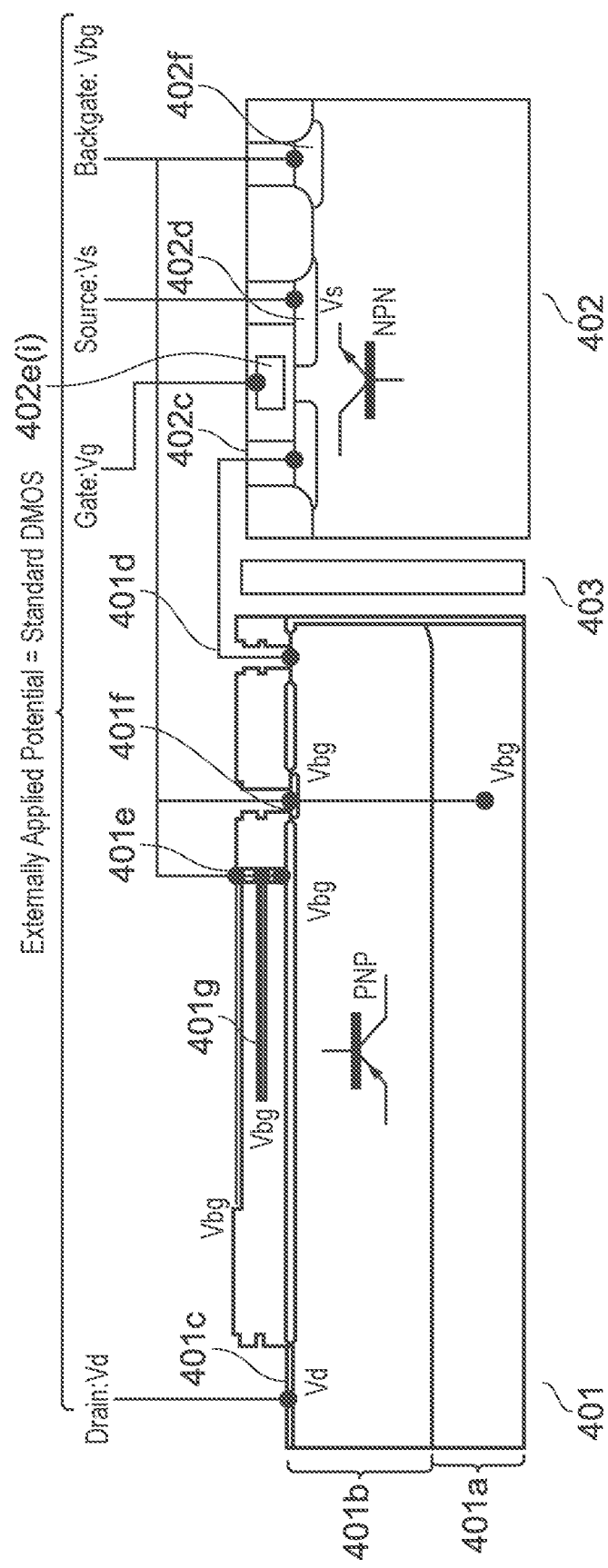
FIG. 4B shows the electrical connections in the LDMOS device of FIG. 4A.

FIG. 4B is a simplified version of the device in FIG. 4A showing the electrical connections between the different regions for the LDMOS device of FIG. 4A. FIG. 4B shows that the backgate 402f of the second section 402 is electrically coupled to the backgate 401f of the first section 401, the p-substrate 401a of the first section, the polysilicon structure 401e of the first section and to the field plates of the resurf structure 401g of the first section 401. The second n-doped region 401d of the first section 401 is electrically coupled to the first n-doped region 402c of the second section. The backgate terminal for the LDMOS device of FIG. 4B is at the backgate 402f of the second section 402, as indicated in FIG. 4B. The drain terminal for the LDMOS device of FIG. 4B is at the drain 401c of the first section 401, as indicated in FIG. 4B. The gate terminal for the LDMOS device of FIG. 4B is at the gate 402e(i) of the second section 402, as indicated in FIG. 4B. The source terminal for the LDMOS device of FIG. 4B is at the source 402d of the second section, as indicated in FIG. 4B. In some embodiments, the source terminal and the backgate terminal can be shorted.

FIG. 4A also indicates that during operation of the LDMOS device, the first section 401 behaves as an effective high-voltage junction gate field effect transistor (JFET) and second section 402 behaves as an effective low-voltage MOSFET. The bottom-gate of the high-voltage JFET is then the epitaxially grown p-doped silicon layer of the p-substrate 401a and this is held at the same potential as the backgate 401f which functions as the top-gate of the effective high-voltage JFET. As indicated using dashed lines in FIG. 4A, depletion regions spread from the top and bottom gate of the effective high voltage JFET. The depletion regions can be configured to pinch-off the drain 401c from the second n-doped region or effective source 401d of the JFET, at a pinch-off voltage defined by the dopant concentration of the n-well 401b. This shields the effective source 401d of the JFET from the high voltage potential applied to the drain and the n-well acts as a potential divider. The electron current (dashed blue line) from the source terminal of the JFET (or the second n-doped region 401d of the first section) to the drain terminal flows between the depletion regions, as indicated in FIG. 4B.

The inventors have found that the above-mentioned problem of the hole current being proportional to the current $I_{NPN}$ of the parasitic NPN bipolar junction transistor in transient mode, is not observed in the device structure of FIG. 4A. This is firstly because, in the device of FIG. 4A, the parasitic NPN bipolar transistor is isolated from the n-well region, where the hole current is generated due to weak-impact ionization, by means of the vertical trench 403. Secondly, in the device of FIG. 4A, the hole current due to weak impact ionization, sinks out of the backgate contacts to ground. As a result, the device structure of FIG. 4A, overcomes the problem of gate-oxide rupture which occurs during transient mode operation of an n-channel LDMOS device.

In a chip implementing the LDMOS device of FIG. 4A, it is not required for the second section 402 to be positioned adjacent the first section 401—that is, as the physical structure of the second section 402 is dielectrically isolated from the first section 401 using the trench 403, an additional design freedom can be achieved by locating the second section 402 elsewhere if desired, for example to optimize usage of chip area, provided the external electrical connections between the two sections are still made as explained above.

FIG. 5A shows another embodiment 500 of an LDMOS device according to the present disclosure. The device structure is similar to the LDMOS device in FIG. 1A. However, in the device of FIG. 5A the n-well region 503 and the p-well region 504 are both multilayer regions. The n-well region 503 comprises an n-doped buried region 503a and a further n-doped region 503b over the buried n-doped region. The multilayer p-well region 504 comprises a buried p-doped region 504a which is directly over the p-type epitaxial region 502b and a further p-doped region 504b over the buried p-doped region 504a. The n-well region 503 is proximal to a first side of the device 500a. The p-well region 504 is proximal to the trench 505 which is on a second side 500b of the device, opposite to the first side 500a. In the device 500 of FIG. 5A, the buried n-doped 503a and buried p-doped 504a regions are directly over an epitaxially grown p-doped layer 502b of the p-substrate. The n-doped region 503b extends by a predetermined length over the junction 511 between the buried p-well 504a and n-well 503a regions, in the direction towards the trench 505.

FIG. 5B shows an example doping concentration profile of the different p-doped regions of the device of FIG. 5A.

The inventors have found that the incorporation of the buried p-well region 504a has the effect of reducing the gain of the parasitic NPN bipolar transistor which can be activated during the transient mode operation of the LDMOS device. The buried p-well region 504a has the effect of adding dopant to the base of the parasitic NPN bipolar transistor, which in turn reduces its gain. In view of the above-mentioned discussion of the problem of gate oxide rupture during transient mode, reducing the gain of the NPN transistor would in turn have the effect of reducing the hole current density which is proportional to the current generated by the NPN transistor. An additional advantage of incorporating the buried p-well region 504a is that the buried layer has the effect of reducing the backgate resistance. This in turn reduces the likelihood of any transient glitches in the power supply to turn on the parasitic bipolar transistor, thereby making the device more robust. As a result of the above mentioned advantages associated with the device structure of FIG. 5A, the likelihood of a gate oxide rupture during transient mode operation of the LDMOS device is reduced.

In practical applications, as also seen in FIG. 5A, an edge of the buried p-well region 504a or equivalently, the junction 511 between the buried n-well region 503a and the buried p-well region 504a, is configured to be aligned with an edge of the gate polysilicon layer close to a bird's beak as defined by the LOCOS field oxide region 510a, where the bird's beak also forms the transition 510b between the LOCOS field oxide region 510a and the thin gate oxide region 510c. Such an alignment can be achieved during fabrication of the device by aligning the edge of the buried p-well region 504a or equivalently, the junction 511 between the buried n-well region 503a and the buried p-well region, with an edge of the gate mask. The inventors have found that aligning the edge of the buried p-well region 504a to the gate mask in this way further improves the effect of reducing the gain of the parasitic NPN bipolar transistor. The inventors have found that undesirable out-diffusion from the buried p-well region 504a can be avoided when the alignment of the edge of the buried p-well region 504a with an edge of the gate mask is made with a tolerance between, approximately 0.5 μm to 1 μm, and more preferably, around 1 μm.

FIG. 6 is a further embodiment of an LDMOS device 600 according to the present disclosure. The cross-section of FIG. 6 is a simplified version of the cross-section of FIG. 5A, except that FIG. 6 comprises a p-type implanted region 604c under the source and backgate of the LDMOS device. The implanted region has a higher dopant concentration than the surrounding p-well region 604b, preferably, the implanted region has an overall dopant concentration of about 1E18 $cm^{-3}$. The implanted region 604c may be in combination with the buried p-doped region 604a as shown in FIG. 6 or on its own. By using kinetic energy to implant dopant under the source 607 and backgate 608 of the LDMOS 600, the inventors have found that it is possible to position the implanted region 604c so that laterally the MOS action along the inverted channel (see channel 114 in FIG. 1A) is unaffected. However, the vertical parasitic bipolar action during transient mode, is significantly reduced because of the additional p-type dopant in the base of the parasitic NPN transistor. Further, the highly doped region on the source 607 shields it from any potential drop created by transient backgate currents. This prevents transient glitches from turning on the parasitic bipolar transistor as the implanted region also helps to reduce the backgate resistance.

Examples

We will now describe methods for fabricating a LDMOS transistor according to embodiments described in the above disclosure by way of examples as detailed below.

Example 1 is a method for fabricating a LDMOS transistor, comprising: providing a wafer; forming a drain, a gate, a source and a backgate; and forming an isolation structure configured to physically isolate a first region comprising the drain of the LDMOS transistor from a second region, having, in use, a parasitic bipolar junction transistor.

Example 2 is the method for fabricating a LDMOS transistor according to Example 1, wherein the method comprises forming an n-channel LDMOS transistor.

Example 3 is the method for fabricating a LDMOS transistor according to Example 1, wherein the method comprises forming a p-channel LDMOS transistor.

Example 4 is the method for fabricating a LDMOS transistor according to Example 1, wherein forming an isolation structure comprises forming a dielectric trench.

Example 5 is a method for fabricating an n-channel LDMOS transistor comprising: providing a wafer; forming a drain, a gate, a source; and a backgate; forming a field oxide region extending laterally between the drain and the gate; forming a gate oxide region extending laterally between an edge of the field oxide region and the source; forming a p-doped region, wherein the p-doped region is configured to reduce, in use, the gain of a parasitic bipolar transistor; forming a p-doped buried layer in the p-doped region such that the buried layer is separated from the source and the backgate by the remainder of p-doped region, wherein forming a p-doped buried layer further comprises aligning an edge of the p-doped buried layer with an edge of the gate proximal to a transition between the field oxide region and the gate oxide region.

Example 6 is the method for fabricating the n-channel LDMOS transistor according to Example 5, wherein forming the p-doped buried layer comprises implanting the p-doped buried layer with a higher dopant concentration than the remainder of the p-doped region.

Example 7 is the method for fabricating the lateral n-channel LDMOS transistor according to Example 5 or 6, wherein forming the p-doped region comprises: forming the p-doped buried layer over a p-type epitaxial layer; and forming a p-well region over the p-doped buried layer, wherein the source and the backgate are formed in the p-well region.

Although this disclosure has been described in terms of certain embodiments, the embodiments can be combined to provide further embodiments. In addition, certain features shown in the context of one embodiment can be incorporated into other embodiments as well. While the disclosure has been described in the context of n-channel LDMOS transistors, the teachings of this disclosure are equally applicable to p-channel LDMOS transistors.

What is claimed is:

1. A lateral double-diffused metal oxide semiconductor (LDMOS) transistor comprising:
   a drain;
   a gate;
   a source; and
   a backgate,
   wherein the LDMOS transistor further comprises an oxide-filled trench isolation structure configured to physically isolate a first region comprising the drain of the LDMOS transistor from a second region comprising the source of the LDMOS transistor, the second region having a parasitic bipolar junction transistor.

2. The LDMOS transistor according to claim 1, wherein the LDMOS transistor comprises an n-channel LDMOS transistor, and wherein the parasitic bipolar junction transistor comprises a parasitic NPN bipolar junction transistor.

3. The LDMOS transistor according to claim 1, wherein the LDMOS transistor comprises a p-channel LDMOS transistor and wherein the parasitic bipolar junction transistor comprises a parasitic PNP bipolar junction transistor.

4. The LDMOS transistor according to claim 1, wherein the gate comprises a polysilicon-on-oxide structure in the second region.

5. The LDMOS transistor according to claim 2, wherein the backgate comprises a p-doped structure in the first region coupled to a polysilicon-on-oxide structure in the first region, to a p-doped substrate in the first region, and to a p-doped structure in the second region.

6. The LDMOS transistor according to claim 2, wherein a first n-doped well in the first region is coupled to a second n-doped well in the second region.

7. The LDMOS transistor according to claim 1, wherein the source is coupled to the backgate.

8. The LDMOS transistor according to claim 1, wherein the first region further comprises a resurf structure configured to control a charge distribution in the first region.

9. The LDMOS transistor according to claim 8, wherein the resurf structure comprises:
   a first field plate; and
   a second field plate,
   wherein the second field plate is positioned above the first field plate and wherein the second field plate is parallel to the first field plate, and wherein the second field plate is configured to be coupled to the first field plate.

10. An n-channel lateral double-diffused metal oxide semiconductor (LDMOS) transistor comprising:
   a first region configured to operate as a junction gate field effect transistor (JFET); and
   a second region configured to operate as a metal oxide semiconductor field effect transistor (MOSFET),
   wherein the first region is configured to generate a first current due to weak-impact ionization, wherein the second region is configured to generate a second current due to a parasitic NPN transistor in the second region, and wherein the first region is configured to be isolated from the second region by an oxide-filled trench isolation structure such that the first current is not proportional to the second current.

* * * * *